United States Patent [19]

Yano et al.

[11] Patent Number: 4,538,121

[45] Date of Patent: Aug. 27, 1985

[54] HIGH FREQUENCY GENERATOR WITH OUTPUT SHUT-OFF OR REDUCED BY BIASING MULTIPLIER DIODE

[75] Inventors: Yasuhiro Yano, Inagi; Isamu Umino, Kawasaki; Zenichi Ohsawa, Yokohama; Takayuki Ozaki, Tochigi, all of Japan

[73] Assignee: Fujitsu Limited, Kawasaki, Japan

[21] Appl. No.: 452,922

[22] Filed: Dec. 27, 1982

[30] Foreign Application Priority Data

Dec. 29, 1981 [JP] Japan .................. 56-212127

[51] Int. Cl.³ .............. H03L 7/06; H03B 1/00
[52] U.S. Cl. ..................... 331/25; 331/76; 331/77; 331/DIG. 2
[58] Field of Search .......... 331/76, 77, DIG. 2, 331/25

[56] References Cited

U.S. PATENT DOCUMENTS

| | | | |
|---|---|---|---|
| 3,307,117 | 2/1967 | Williams | 331/76 |
| 3,397,369 | 8/1968 | Uhlir | 331/76 |
| 3,401,355 | 9/1968 | Kafitz | 331/76 |
| 3,671,880 | 6/1972 | Kuiper et al. | 331/76 X |
| 3,697,995 | 10/1972 | Kafitz | 331/53 X |
| 4,039,968 | 8/1977 | Emshwiller | 331/76 X |
| 4,199,734 | 4/1980 | Dressen | 331/76 |

FOREIGN PATENT DOCUMENTS 2350626 4/1975 Fed. Rep. of Germany ........ 331/76

OTHER PUBLICATIONS

Kuno, H. J. et al., "Solid State Millimeter-Wave Sources" 24-2A-EASCON 77, Arlington, Va., USA, pp. 26-28, Sep. '77.

Primary Examiner—Eugene R. LaRoche
Assistant Examiner—D. C. Mis
Attorney, Agent, or Firm—Staas & Halsey

[57] ABSTRACT

A high frequency generator including a frequency generator and a multiplier, the multiplier including a diode, which multiplies the output frequency of the frequency generator, and shuts off or reduces an output by suspending or suppressing the multiplying operation through the control of a bias voltage applied to the diode used in the multiplier. The system for cutting off the output by controlling the multiplier is very effective for simplifying the circuit structure and reliably turning off the output.

8 Claims, 6 Drawing Figures

HIGH FREQUENCY GENERATOR WITH OUTPUT SHUT-OFF OR REDUCED BY BIASING MULTIPLIER DIODE

BACKGROUND OF THE INVENTION

This invention relates to a device for generating high frequency signals such as microwave or milliwave signals and particularly to a method of controlling an output of a high frequency generator, including miltiplier means, having diodes, within the output of the generator.

High frequency generators, generators used for obtaining predetermined frequency signals by multiplying the outputs from a high frequency oscillator comprising a frequency stabilizing circuit such as Phase Lock Loop (PLL), are known. The high frequency generating means is required to turn the output off for a while after the power switch is turned on, because an abnormal frequency may be generated up until the frequency stabilization reaches a steady state due to the operation of a frequency stabilizing circuit.

The output of a high frequency generating means is turned off by the following methods: first, an ON/OFF circuit, such as diode switch using a PIN diode or coaxial relay, is inserted into the output and second, an output is turned off through suspension of operation by changing the bias of an amplifier used in the output circuit. The former method has a disadvantage in that the circuit structure is complicated because an ON/OFF circuit is added and moreover signal loss therein is inevitable. The latter method cannot be applied in a device not having an amplifier. In both of these methods, the output is turned off in the output frequency stage and shielding must be taken into account in order to obtain a large attenuation of the output, resulting in an increase in the device cost.

SUMMARY OF THE INVENTION

It is an object of the present invention to provide means having a simple circuit structure for reliably turning off an output by controlling a bias voltage applied to a mulitplying means, included in a high frequency generatinng means, comprising an oscillator and a multiplier.

Therefore, this invention provides a high frequency generator which is capable of attentuating and turning off the output by forming a multiplier means, connected to the output of an oscillator, having a diode and controlling the bias voltage applied to the diode.

DESCRIPTION OF THE PREFERRED EMBODIMENTS

Figure 1:
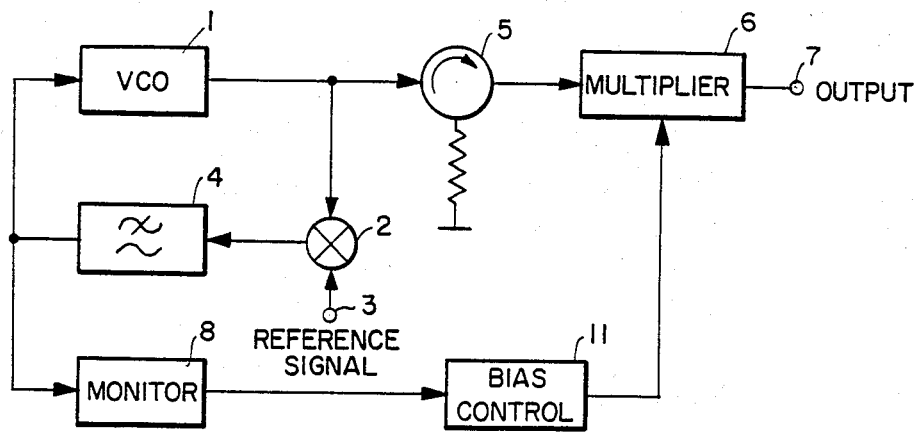
FIG. 1 is a block diagram of an embodiment of a high frequency generator of the invention.

FIG. 1 is an embodiment of a high frequency generator of the invention. In FIG. 1, 1 is a voltage controlled oscillator (referred to hereinafter as a VCO). An output of the VCO 1 is applied to a harmonic mixer 2 and is compared with a reference frequency input signal from terminal 3. An error signal output of the harmonic mixer 2 is fed back to the VCO 1 through a loop filter 4, thus forming a phase lock loop (referred to hereinafter as a PLL). An output of the VCO 1 is applied to a multiplier means 6 via a circulator 5, forming an isolator, and is multiplied to provide a high frequency output to the output terminal 7. A monitoring circuit 8 monitors the synchronization of the PLL depending on the output of the loop filter 4. When the detected output of the monitoring circuit becomes OFF, a bias controlling means 11 generates a specified control voltage and the voltage is applied to the multiplier means 6. Thus, the high frequency output of the multiplier means 6 becomes OFF.

The PLL circuit comprising the VCO 1, harmonic mixer 2 and loop filter 4, is already known. The oscillation frequency $f_o$ of the VCO 1 is controlled by a signal applied thereto via the loop filter 4. However, since the reference frequency input signal, $f_R = f_o/n_1$, having a high frequency stability and generated by a crystal oscillator etc., is applied to the terminal 3, the harmonic mixer 2 compares the phases between the harmonic $f_o$ which is $n_1$ times the reference frequency signal and an output signal $f_o$ of the VCO 1 and generates an error signal output. The error signal output of the harmonic mixer 2 passes the loop filter 4 and is fed back to the VCO 1 as a high frequency control voltage. Accordingly, control is carried out in the PLL circuit so that the error signal output from the harmonic mixer 2 is close to zero, thereby stabilizing the oscillation frequency of the VCO 1.

An oscillation output signal of the VCO 1 is input to the multiplier means 6 via the circulator 5. The circulator 5 is provided to reduce the load effect on the multiplier means 6 When the input frequency $f_0$ is about 2 GHz, the multiplier means 6 uses a step recovery diode (referred to hereinafter as a SRD) as a semiconductor element and is capable of obtaining the multiplication steps $n_2 = 4$, etc.

Figure 2:
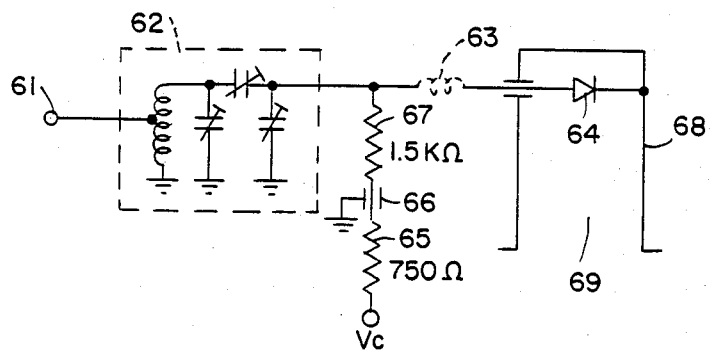
FIG. 2 is a schematic diagram of the multiplier means 6 of FIG. 1.

FIG. 2 is an example of a multiplier means using a step recovery diode. In the figure, 61 is an input terminal and the input signal, for example, $f_0 = 2$ GHz is input thereto. A resonant circuit, 62 resonates with the input signal $f_0$. An output of the resonant circuit 62 is supplied to the SRD 64 via a small driving inductance 63 which is equivalently formed by a lead wire. A bias voltage $V_c$ is input to the SRD 64 via the decreasing connector circuit comprising a resistor 65, bypass capacitor 66 and resistor 67. The SRD 64 is provided within a waveguide 68 and a multiplier signal generated by the SRD 64, for example, $4f_0 = 8$ GHz can be extracted from the waveguide output 69.

The step recovery diode changes its equivalent capacitance depending on the bias condition. It has a very small static capacitance $C_{VR}$ determined by the diode characteristic under a reverse bias condition and a large static capacitance $C_{FWD}$ under a forward bias condition. Usually, $C_{VR} = 0.5$ to 5 pF and $C_{FWD}$ goes to infinity. In the circuit of FIG. 2, the SRD 64 can be alternately biased forward and reverse for each cycle of the input signal $f_0$ by providing an adequate bias voltage $V_c$. When the SRD 64 is forward biased, energy is accumulated in the driving inductance 63, and when the SRD 64 is reverse biased and the static capacitance is switched from $C_{FWD}$ to $C_{VR}$, energy accumulated in the inductance is released. Thus a narrow high frequency pulse is generated across the SRD 64.

Figure 4:
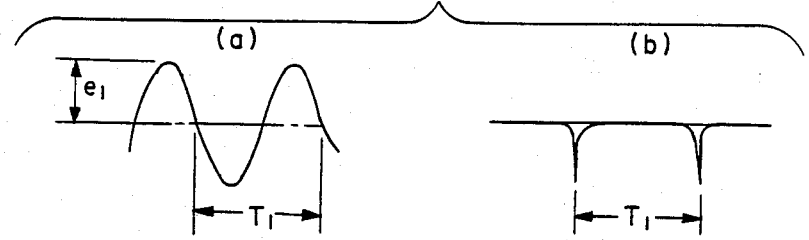
FIG. 4 is a waveform diagram of the input signal of the multiplier means and the output signal of a step recovery diode.

FIG. 4 shows waveforms of the input signal of multiplier means and the output of the step recovery diode. In the figure, (a) is the waveform of signal $f_0$ of the input terminal 61, which is almost a sine wave having an amplitude of $e_1$ and period of $T_1$. On the other hand, (b) is the output waveform of the SRD 64 having the same period $T_1$ and is a sharp pulse. The sharp pulse waveform usually contains harmonics of higher orders and the multiplier means can extract the signal of desired order from the harmonics. In FIG. 2, the waveguide 68 equivalently forming a band-pass filter which resonates at the specified frequency band. For example, only the quadrupled harmonic $4f_0=8$ GHz is selected and extracted through the output terminal 69. In the circuit of FIG. 2, when a high frequency $f_0=2.0$ GHz with a level of 20 dBm is input, an output of for example, a higher frequency $4f_0$ and a level of, about 15 dBm, is obtained with the bias voltage $V_c=0$.

Figure 3:
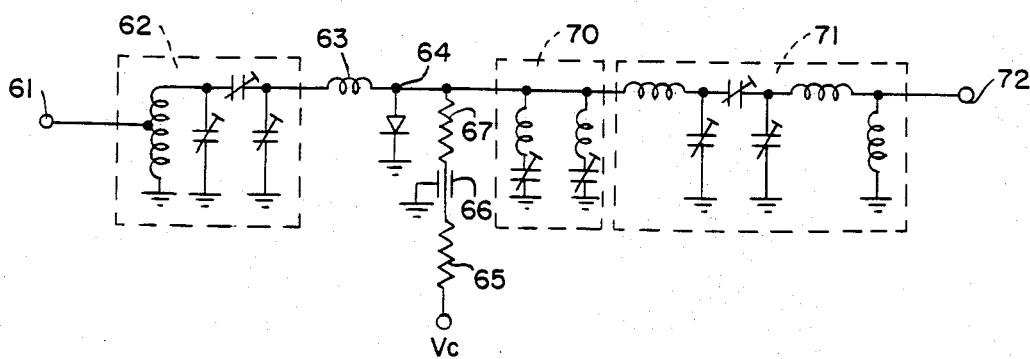
FIG. 3 is a schematic diagram of a second embodiment of the multiplier means 6 of FIG. 1.

FIG. 3 is a second circuit structure of multiplier means utilizing a step recovery diode. The circuit is preferred for use in a plane circuit formed with a microstrip line. In FIG. 3, the portions given the same reference numbers as those of FIG. 2 indicate the same element.

In the example of the circut shown in FIG. 3, an idler 70 comprising an LC series circuit having the specified resonant frequency is connected to bias supplying means. The idler 70 functions as a band-reject filter (BRF) and reduces the impedance of the specific frequency near the SRD 64. For example, the input signal $f_o=2$ GHz sent from the input terminal 61, is input to the SRD 64 and the harmonic signals are extracted and input to the idler 70. The idler 70 is composed of the LC circuits which respectively, resonate at the frequencies of 4 GHz and 6 GHz. The specific frequency signals are reflected and are again input to the SRD 64. Energy of the reflected signals is used for extraction of the specified multiplied frequency signal, for example $4f_o=8$ GHz, improving efficiency of operation.

The high frequency signal, having passed the idler 70, is input to the resonator circuit 71 in order to extract only the specified multiplied frequency signal. The resonantor circuit 71 allows, for example, only the $4f_o$ signal = 8 GHz to pass and provides the function of a band-pass filter. It functions as the waveguide 69 shown in FIG. 2. The signal obtained from the resonator circuit 71 is output to the output terminal 72.

Figure 5:
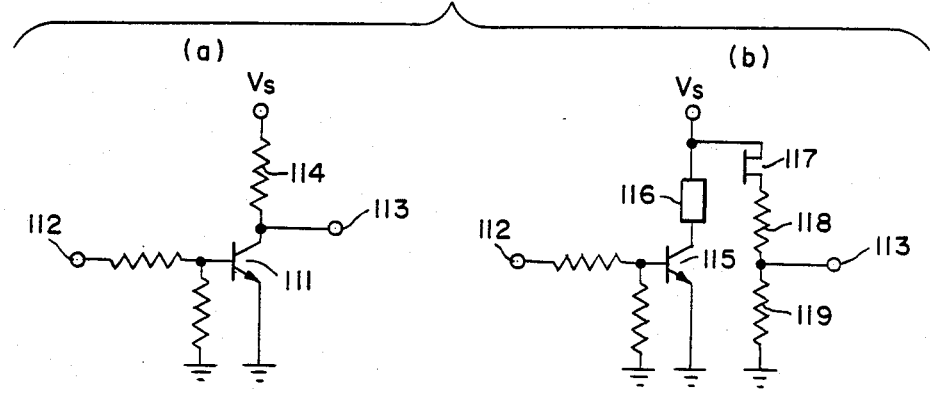
FIG. 5 (*a*) and (*b*) are schematic diagrams of the bias voltage controlling means 11 of FIG. 1.

In the high frequency generator shown in FIG. 1, the synchronization of the PLL circuit is monitored by the monitoring circuit 8. It does so by obtaining the synchronous detecting signal from a subtraction output by comparison of the control voltage and reference voltage signal utilizing, for example, that the control voltage is fed back to the VCO 1 via the loop filter 4 and is not in the specified voltage range during the synchronous condition. When a synchronous detecting signal is generated from the monitoring circuit 8, the bias control circuit 11 is controlled and thereby the bias voltage of the multiplier means is changed. FIG. 5 is a circuit diagram of a bias voltage control circuit. FIG. 5 (a) is an example a bias voltage control circuit using a transistor 111. The NPN transistor 111 is in a cut-off condition when an input signal is not applied from an input terminal 112 and therefore a positive voltage is generated at the output terminal 113 from the power source $V_s$ via an resistor 114. When the synchronous detecting signal is applied to the terminal 112, the transistor 111 becomes conductive and its collector voltage becomes approximately 0 V and therefore the output terminal 113 is set to ground potential. Thus, the bias voltage of multiplier means 8 changes.

FIG. 5 (b) is a bias voltage control circuit using a relay in place of a transistor. When there is no input at the terminal 112, the NPN transistor is in the cut-off condition, making the relay 116 inoperative. Therefore, the contact 117 closes and a positive voltage is generated at the output terminal 113 from the power source $V_s$ via the voltage dividing circuit comprising the resistors 118 and 119. When the synchronous detecting signal is applied to the terminal 112, the transistor 115 becomes conductive, the relay 116 operates, the contact 117 opens and the terminal 113 is set to ground potential.

Meanwhile, an oscillation output is applied from the VCO 1 to the multiplier means 6 in addition to the bias voltage as explained previously. Therefore, when the bias voltage $V_c$ becomes a higher level than the amplitude of oscillation output signal, the SRD 64 is in the conductive condition, switching between the static capacitances $C_{FWD}$ and $C_{VR}$ is no longer performed at the SRD 64, and the multiplication operation stops. In each circuit of FIG. 5, if a negative bias voltage output is obtained when the synchronous detecting signal is not applied and if the bias voltage level is higher than the oscillation amplitude, the SRD 64 is always in the cut-off condition. In the same way, switching between static capacitances $C_{VR}$ and $C_{FWD}$ is no longer carried out in the SRD 64 and the multiplication operation stops. The above embodiment is an example of using a step recovery diode as the semiconductor device used in the multiplier means 6, but application is not limited in the present invention only to a step recovery diode. That is, the multiplication efficiency in the multiplier means is changed, depending on the bias voltage, by using other types of diodes.

Figure 6:
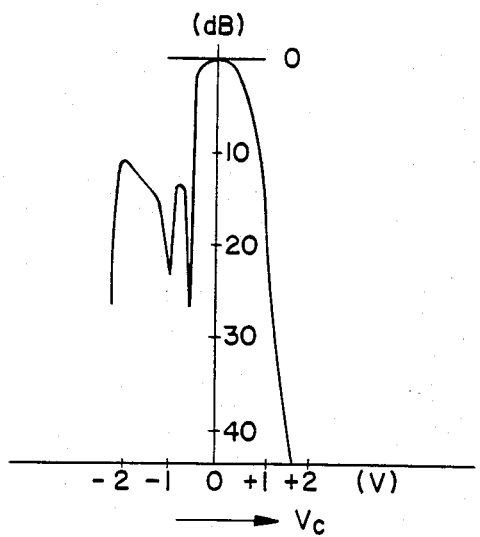
FIG. 6 is a graph of the bias voltage controlling characteristic of the multiplier means 6 of FIG. 1.

FIG. 6 is a graph of the output reduction characteristic where the bias voltage of the multiplier means is changed. The horizontal axis indicates the bias voltage $V_c$, while the vertical axis indicates reduction of the output of the multiplier means resulting from changes in the bias voltage $V_c$ with reference to Vc=0 (at 0 db). The bias voltage $V_c$ around $V_c=0$ changes about +0.2 V and the output voltage of the multiplier means changes slightly. In the range of +1 V or more or −2.2 V or less, it has been confirmed that the output voltage of the multiplier means is zero or very small.

According to the invention, an output of a high frequency generator comprising generating means and multiplier means including a diode for mutiplying an output frequency of the generating means, can be kept off or the voltage reduced by suspending or suppressing the multiplying operation through the control of the bias voltage of the diode used in the multiplier means.

Therefore, according to the microwave generator of the invention, a high frequency output can be cut-off by controlling a generator using the multiplier means. Thus, the circuit structure can be simplified and a sufficiently large output attenuation can be realized by suspending the operation of the multiplier means. From this point of view, the invention is very effective in keeping the output of the device off.

In addition, explained in the above embodiment is only a method of controlling a microwave output with the synchronous detecting signal sent from the PLL, but the microwave generator of this invention is also capable of controlling an output signal with a control signal from an external circuit.

What is claimed is:

1. A high frequency generator comprising:
   generating means for generating a high frequency signal, said generating means comprising a phase-locked loop, including:
   a voltage controlled oscillator generating a first output signal and having an input terminal;
   a reference signal generator, operatively connected to said voltage controlled oscillator, for providing a reference signal;
   mixing means having an output terminal, operatively connected to said voltage controlled oscillator and said reference signal generator, for mixing the first output signal and the reference signal, and outputting a signal in accordance with a phase-difference between the first output signal and the reference signal; and
   a loop-filter, operatively connected to said output terminal of said mixing means and said input terminal of said voltage controlled oscillator, for supplying a control signal to said voltage controlled oscillator, wherein said voltage controlled oscillator generates the first output signal in dependence upon the control signal supplied from said loop-filter;
   multiplier means, operatively connected to said generating means, for receiving and multiplying the high frequency signal and outputting harmonic frequency signals, said multiplier means including:
   an input terminal, operatively connected to said generating means, for receiving the high frequency signal;
   a multiplier diode, operatively connected to said input terminal, for providing harmonic frequency signals of the high frequency signal; and
   means, operatively connected to said multiplier diode, for supplying a bias voltage to said multiplier diode, so that the harmonic frequency signals of said multiplier means are controlled in accordance with the bias voltage supplied to said multiplier diode;
   bias controlling means, operatively connected to said multiplier means, for controlling the bias voltage supplied to said multiplier diode;
   output means, operatively connected to receive the harmonic frequency signals from said multiplier means, for outputting a fixed harmonic signal of the harmonic frequency signals; and
   a monitoring circuit, operatively connected to said output terminal of said mixing means, for monitoring the synchronization between the reference signal and the first output signal from said voltage controlled oscillator, and for providing an alarm signal to said bias controlling means when the synchronization is not detected by said monitoring circuit.

2. A generator according to claim 1, wherein said multiplier diode is a step-recovery diode.

3. A generator according to claim 1, wherein said multiplier means further includes a wave guide operatively connected to said multiplier diode.

4. A generator according to claim 1, wherein said multiplier means further includes a resonator circuit, operatively connected to said bias voltage supplying means, for resonating at a specified frequency and outputting the fixed harmonic signal.

5. A generator according to claim 1, wherein said mixing means is a harmonic mixer circuit, and wherein said harmonic mixer circuit outputs a signal proportional to the difference between the first output signal of said voltage controlled oscillator and the reference signal.

6. A generator according to claim 1, wherein said multiplier means further comprises:
   a resonator circuit, operatively connected between said input terminal of said multiplier means and said multiplier diode, for resonating at a specified frequency and supplying the specified frequency to said multiplier diode;
   a driving inductance, operatively connected between said resonator circuit and said multiplier diode, for driving said multiplier diode which provides the harmonic frequency signals; and
   a waveguide, operatively connected to said multiplier diode, having a specified resonant frequency and wherein said multiplier diode is mounted.

7. A generator according to claim 1, wherein said multiplier means has an output terminal and further comprises:
   a first resonator circuit having an output, operatively connected between said input terminal of said multiplier means and said multiplier diode, for resonating at a specified frequency and supplying the specified frequency to said multiplier diode;
   a driving inductance, operatively connected between said first resonator circuit and said multiplier diode, for driving said multiplier diode to provide the harmonic frequency signals;
   an idler circuit, operatively connected to said multiplier diode, for reflecting a specified frequency signal and supplying energy to said multiplier diode; and
   a second resonator circuit, operatively connected between said idler circuit and the output terminal of said multiplier means, for resonating at the specified frequency to provide the fixed harmonic signal at the output terminal.

8. A high frequency generator comprising:
   generating means for generating a frequency signal, comprising a phase-locked loop, including:
   a voltage controlled oscillator having a first output signal and having an input terminal;
   a reference signal generator, operatively connected to said voltage controlled oscillator, for providing a reference signal;
   mixing means having an output terminal, operatively connected to said voltage controlled oscillator and said reference signal generator, for mixing the first output signal and the reference signal, and outputting a signal in accordance with a phase-difference between the first output signal and the reference signal; and
   a loop-filter, operatively connected to said output terminal of said mixing means and said input terminal of said voltage controlled oscillator, for supplying a control signal to said voltage controlled oscillator, wherein said voltage controlled oscillator generates the first output signal in dependence upon the control signal supplied from said loop-filter;

multiplier means, operatively connected to said generating means, for receiving and multiplying the frequency signal and providing harmonic frequency signals having a frequency higher than that of the frequency signal of the generating means, said multiplier means comprising:

an input terminal, operatively connected to said generating means, for receiving the frequency signal;

a multiplier diode, operatively connected to said input terminal, for providng harmonic frequency signals of the frequency signal; and means, operatively connected to said multiplier diode, for supplying a bias voltage to said multiplier diode, the harmonic frequency signals of said multiplier means being controlled in accordance with the bias voltage supplied to said multiplier diode;

bias controlling means, operatively connected to said multiplier means for controlling the bias voltage supplied to said multiplier diode;

an output terminal, operatively connected to said multiplier means, for outputting a fixed harmonic signal of the harmonic frequency signals; and a monitoring circut, operatively connected to said output terminal of said mixing means, for monitoring the synchronization between the reference signal and the first output signal from said voltage controlled oscillator, and for providing an alarm signal to said bias controlling means when synchronization between the reference signal and the first output signal is not detected by said monitoring means.

* * * * *